United States Patent
Gupta et al.

(10) Patent No.: US 11,095,297 B2
(45) Date of Patent: Aug. 17, 2021

(54) PHASE LOCKED LOOP (PLL) CIRCUIT WITH VOLTAGE CONTROLLED OSCILLATOR (VCO) HAVING REDUCED GAIN

(71) Applicant: STMicroelectronics International N.V., Geneva (CH)

(72) Inventors: Nitin Gupta, Kurukshetra (IN); Sagnik Mukherjee, Kolkata (IN)

(73) Assignee: STMicroelectronics International N.V., Geneva (CH)

(*) Notice: Subject to any disclaimer, the term of this patent is extended or adjusted under 35 U.S.C. 154(b) by 0 days.

(21) Appl. No.: 16/895,092

(22) Filed: Jun. 8, 2020

(65) Prior Publication Data

US 2020/0389175 A1 Dec. 10, 2020

Related U.S. Application Data

(60) Provisional application No. 62/859,269, filed on Jun. 10, 2019.

(51) Int. Cl.
*H03L 7/099* (2006.01)
*H03L 7/093* (2006.01)
*H03L 7/089* (2006.01)

(52) U.S. Cl.
CPC .......... *H03L 7/0995* (2013.01); *H03L 7/0891* (2013.01); *H03L 7/093* (2013.01); *H03L 7/0992* (2013.01)

(58) Field of Classification Search
CPC ..... H03L 7/0995; H03L 7/0891; H03L 7/093; H03L 7/0992; H03L 7/08; H03L 7/0802; H03L 7/0805; H03L 7/0807; H03L 7/083; H03L 7/085; H03L 7/095; H03L 7/097; H03L 7/099; H03L 7/10; H03L 7/14; H03L 7/16; H03L 7/18; H03L 7/20
USPC ........................................................ 327/156
See application file for complete search history.

(56) References Cited

U.S. PATENT DOCUMENTS

| | | | |
|---|---|---|---|
| 6,466,100 B2 | 10/2002 | Mullgrav, Jr. et al. |
| 7,633,347 B2 | 12/2009 | Tan et al. |
| 7,915,963 B2 | 3/2011 | Kelkar et al. |
| 8,044,727 B2 | 10/2011 | Higashi |
| 8,461,885 B2 | 6/2013 | Nguyen et al. |
| 8,854,095 B2 | 10/2014 | Katyal |
| 9,455,728 B2 | 9/2016 | Deng et al. |

(Continued)

OTHER PUBLICATIONS

Abhijith Arakali, Srikanth Gondi and Pavan Kumar Hanumolu, "Low-Power Supply-Regulation Techniques for Ring Oscillators in Phase-Locked Loops", IEEE Journal of Solid-State Circuits, vol. 44, No. 8, Aug. 2009.

*Primary Examiner* — John W Poos
*Assistant Examiner* — Alex W Lam
(74) *Attorney, Agent, or Firm* — Crowe & Dunlevy (57) ABSTRACT

A voltage controlled oscillator (VCO) circuit generates an output signal having a frequency which is dependent on a control voltage. A current is generated which is itself dependent on an amplitude of the VCO circuit. The generated current accordingly tracks, to an extent, the temperature behavior of the oscillator within the VCO circuit. The oscillator is driven by the sum of the generated current and a control current dependent on the control voltage. The control voltage may, for example, be generated by a phase lock loop (PLL).

19 Claims, 3 Drawing Sheets

(56) References Cited

U.S. PATENT DOCUMENTS

| | | | | |
|---|---|---|---|---|
| 2004/0251973 A1* | 12/2004 | Ishida | .................. | H03L 7/0812 |
| | | | | 331/16 |
| 2008/0122546 A1* | 5/2008 | Shiramizu | ............. | H03L 7/0995 |
| | | | | 331/34 |
| 2012/0223780 A1* | 9/2012 | Urakawa | .............. | H03K 3/0315 |
| | | | | 331/57 |
| 2016/0248376 A1* | 8/2016 | Wu | ...................... | H03K 3/0231 |

* cited by examiner

PHASE LOCKED LOOP (PLL) CIRCUIT WITH VOLTAGE CONTROLLED OSCILLATOR (VCO) HAVING REDUCED GAIN

CROSS-REFERENCE TO RELATED APPLICATION

This application claims priority from U.S. Provisional Application for Patent No. 62/859,269 filed Jun. 10, 2019, the disclosure of which is incorporated by reference.

TECHNICAL FIELD

Embodiments generally relate to a phase locked loop (PLL) circuit and, in particular, to reducing gain for a voltage controlled oscillator (VCO) within the PLL circuit.

BACKGROUND

Figure 1:
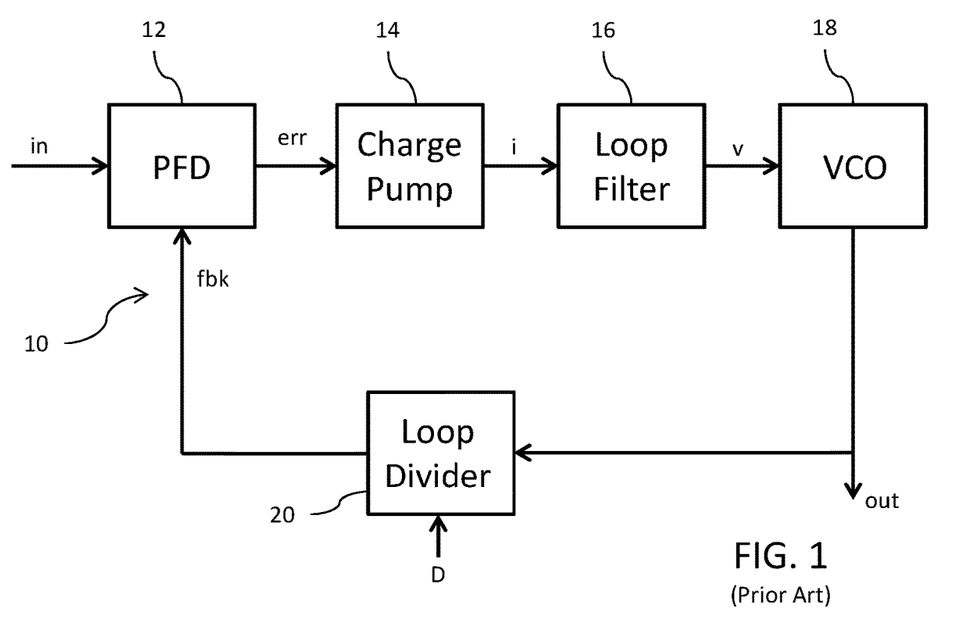
FIG. 1 is a block diagram of a conventional analog phase locked loop (PLL) circuit.

With reference to FIG. 1, a conventional analog phase locked loop (PLL) circuit 10 includes a phase/frequency detector (PFD) circuit 12, a charge pump circuit 14, a loop filter circuit 16, an oscillator circuit 18 (for example, of the voltage-controlled oscillator (VCO) or current-controlled oscillator (CCO) type), and a frequency divider circuit (loop divider) 20. The PFD circuit 12 measures the difference in phase between an input signal (in) and a feedback signal (fbk). The PFD circuit 12 generates an error signal (err) that is proportional to the measured phase difference. The charge pump circuit 14 generates an output current (i) that is proportional to the error signal. The charge pump output current is input to the loop filter circuit 16, and the loop filter circuit outputs a corresponding control voltage (v) that is applied to a control input of the VCO circuit 18. The frequency of the output signal (out) generated by the VCO circuit 18 is dependent on the control voltage output from the loop filter circuit 16. The frequency divider circuit 20 receives the output signal and generates the feedback signal (fbk).

It will be noted that in an embodiment, the frequency divider circuit 20 may be omitted and the feedback signal (fbk) may comprise the output signal (out) generated by the VCO circuit 18. In such a case, the frequency of the output signal (out) will equal the frequency of the input signal (in). With the inclusion of the frequency divider circuit 20 implementing a frequency divisor of D, for example, the frequency of the output signal (out) will equal D times the frequency of the input signal (in). In either case, the PLL operation will lock the phase of the output signal to the phase of the input signal.

Figure 2:
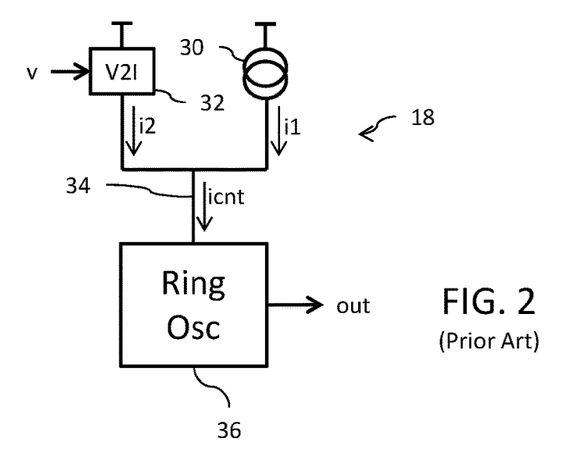
FIG. 2 is a block diagram of the VCO circuit in the PLL circuit of FIG. 1.

It is desirable to reduce the gain of the VCO circuit 18 in order to allow for a higher current in the charge pump circuit 14 and a reduction in noise contributed by the loop filter circuit 16. Alternatively, the charge pump current is maintained and the resistance of the loop filter 16 is increased along with a decrease in capacitance of the loop filter capacitor (by the same factor) to support a reduction in noise and circuit area. Reference is now made to FIG. 2 showing a block diagram of the VCO circuit 18 which includes a first current (i1) inside the oscillator that is a constant current along with a second current (i2) inside the oscillator that is controlled by the control voltage (v). As an example, the first current (i1) is generated by a constant current source 30, and the second current (i2) is generated by a voltage-to-current (V2I) converter circuit 32 responsive to the control voltage (v). The first and second currents are summed at a current summing node 34 to generate a control current (icnt) that is applied to a ring oscillator circuit 36 that generates the output signal (out) having a frequency controlled by the magnitude of the control current (icnt).

Normally, the PLL loop must have sufficient gain to cover the temperature spread of the oscillator circuit 18 and the high frequency effects in the PLL clock frequency. There is a problem, however, in that the constant current source 30 has its own variation with temperature. The typical solution is to use trial based (open loop) control to force the first current (i1) track the temperature spread of the oscillator. This solution is heavily dependent on technology and maturity of computer aided design (CAD) models. There would be an advantage if a more effective solution were available.

SUMMARY

The amplitude of the VCO circuit tracks process, voltage and temperature (PVT) variation as well as the frequency of oscillation. A current that is dependent on the amplitude of the VCO circuit will then track, to an extent, the temperature behavior of the oscillator. This current is applied, along with the control current dependent on the control voltage of the PLL loop, to the ring oscillator circuit that generates the output signal.

In an embodiment, an oscillator circuit comprises: a first voltage to current converter circuit configured to convert a first voltage to a first current; a second voltage to current converter circuit configured to convert a second voltage to a second current; a third voltage to current converter circuit configured to convert a third voltage to a third current; a ring oscillator circuit configured to generate an output signal having a voltage amplitude and having a frequency which is controlled by a sum of the first and second currents; a first amplifier circuit configured to generate a voltage applied as both the first and third voltages in response to a difference between a first feedback voltage and the voltage amplitude; and a first resistor across which the third current is applied to generate the first feedback voltage, wherein the first resistor has a resistance that is substantially equal to an effective resistance of the ring oscillator circuit.

In an embodiment, an oscillator circuit comprises: a first voltage to current converter circuit configured to convert a first voltage to a first current; a second voltage to current converter circuit configured to convert a second voltage to a second current; a third voltage to current converter circuit configured to convert a third voltage to a third current; a ring oscillator circuit configured to generate an output signal having a voltage amplitude and having a frequency which is controlled by a sum of the first and second currents; and a calibration circuit configured to determine a voltage applied as both the first and second voltages which causes the frequency of the output signal from the ring oscillator circuit to have a desired frequency.

In an embodiment, a phase lock loop circuit comprises: a controlled oscillator having an input configured to receive an oscillation control voltage and an output configured to generate an oscillating signal at a frequency set by the oscillation control voltage; and a loop circuit having a first input receiving the oscillating signal, a second input receiving a reference signal and an output generating the oscillation control voltage as a function of a difference between the oscillating signal and the reference signal. The controlled oscillator comprises: a first voltage to current converter circuit configured to convert a current control voltage to a first current; a second voltage to current converter circuit configured to convert the oscillation control voltage to a second current; a third voltage to current converter circuit configured to convert the current control voltage to a third current; a ring oscillator circuit configured to generate the oscillating signal having a voltage amplitude and having a frequency which is controlled by a sum of the first and second currents; a first amplifier circuit configured to generate the current control voltage in response to a difference between a first feedback voltage and the voltage amplitude; and a first resistor across which the third current is applied to generate the first feedback voltage, wherein the first resistor has a resistance that is substantially equal to an effective resistance of the ring oscillator circuit.

In an embodiment, an oscillator circuit comprises: a first voltage to current converter circuit configured to convert a first voltage to a first current; a second voltage to current converter circuit configured to convert a second voltage to a second current; and a ring oscillator circuit configured to generate an output signal having a voltage amplitude and having a frequency which is controlled by a sum of the first and second currents; wherein the first current is dependent on the voltage amplitude and tracks temperature behavior of the ring oscillator circuit.

BRIEF DESCRIPTION OF THE DRAWINGS

For a better understanding of the embodiments, reference will now be made by way of example only to the accompanying figures in which.

DETAILED DESCRIPTION

Figure 3:
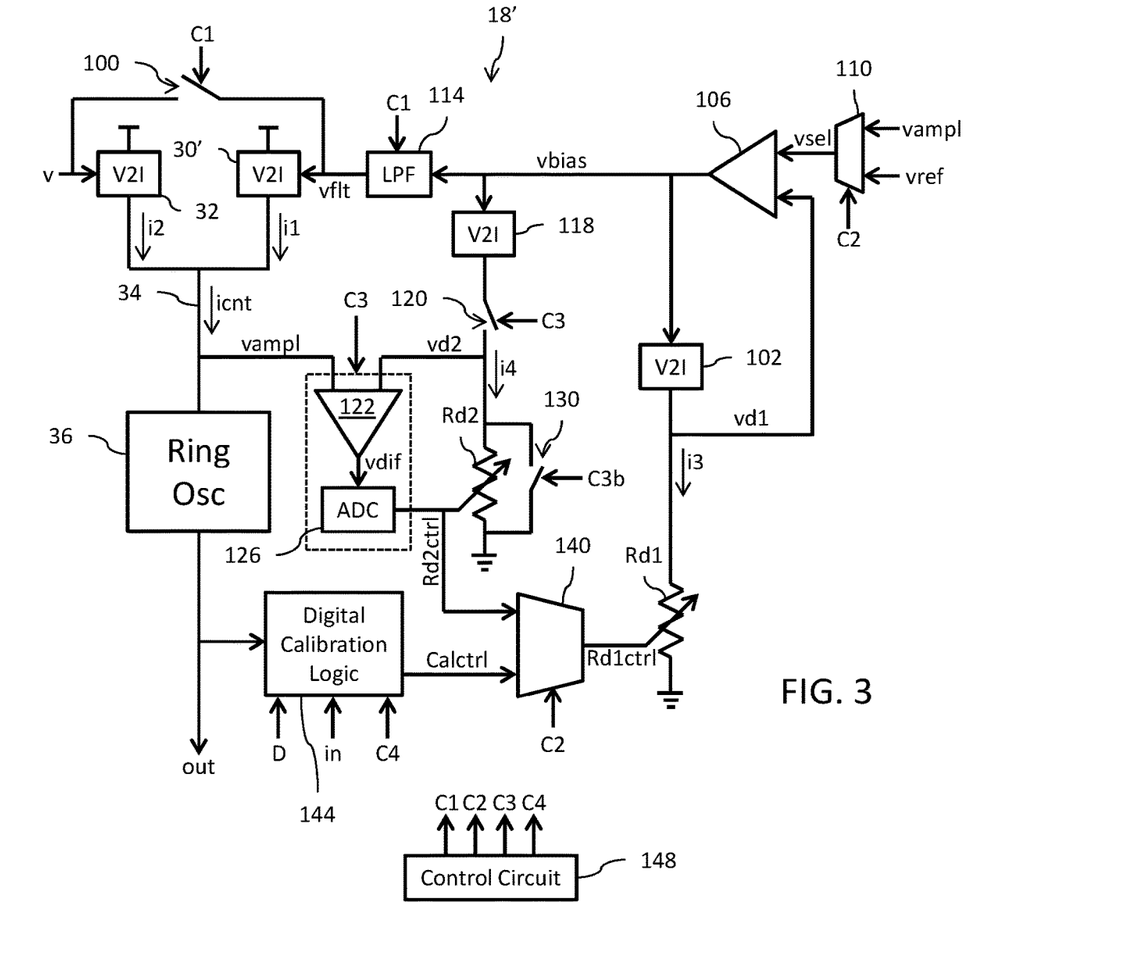
FIG. 3 is a block diagram of a VCO circuit for use in a PLL circuit of the type shown in FIG. 1.

Reference is now made to FIG. 3 which shows a block diagram of a VCO circuit 18' for use in a PLL circuit of the type shown in FIG. 1. The VCO circuit 18' may, for example, be used in place of the VCO circuit 18 as shown in FIG. 1 in order to provide for improved performance of the PLL circuit. Alternatively, the VCO circuit 18' may be used in place of other prior art VCO circuits as needed in a desired circuit application requiring the generation of a clock signal have a controlled frequency.

The VCO circuit 18' includes a first voltage-to-current (V2I) converter circuit 30' configured to generate a first current (i1) in response to (i.e., proportional to) a first control voltage (Vflt) and a second voltage-to-current (V2I) converter circuit 32 configured to generate a second current (i2) in response to (i.e., proportional to) a second control voltage (v). In the context of a PLL circuit implementation as shown in FIG. 1, the second control voltage (v) is the control voltage (v) generated by the loop filter circuit 16 used to set the magnitude of the variable current (i2) for the VCO circuit 18' and the first control voltage (Vflt) is the voltage used to set the magnitude of the constant current (i1) for the VCO circuit 18'. The first and second currents are summed at a current summing node 34 to generate a control current (icnt) that is applied to the ring oscillator circuit 36 that generates the output signal (out) having a desired frequency and amplitude.

A first switching circuit 100 is actuated in response to a first logic state of a first control signal C1 to a switch closed position in order to selectively connect the control voltage inputs of the first and second voltage-to-current (V2I) converter circuits 30' and 32 to each other so that the first control voltage (Vflt) and the second control voltage (v) have equal voltages. The first control signal C1 is in the first logic state to close the first switching circuit 100 during a calibration mode of the operation for the VCO circuit 18' during which the VCO circuit 18' is decoupled from the PLL circuit loop. Conversely, the first control signal C1 is in a second logic state to open the first switching circuit 100 during a normal mode of the operation for the VCO circuit 18' during which the VCO circuit 18' is coupled to the PLL circuit loop. The first control signal C1 accordingly presents a master control signal for VCO circuit 18' calibration.

A third voltage-to-current (V2I) converter circuit 102 receives a bias voltage (vbias) and generates a third current (i3) proportional to that bias voltage. The third current (i3) is applied across a first digitally controlled resistor Rd1 to generate a first feedback voltage (Vd1). A differential amplifier circuit 106 generates the bias voltage (vbias) as the amplified difference between the first feedback voltage (Vd1) and a select voltage (vsel). The select voltage (vsel) is output by a voltage multiplexing circuit 110 that receives both an amplitude voltage (vampl) and a reference voltage (vref). The voltage multiplexing circuit 110 selects between the amplitude voltage (vampl) and the reference voltage (vref) in response to a second control signal C2. The voltage multiplexing circuit 110 will output the amplitude voltage (vampl) as the select voltage (vsel) in response to a first logic state of the second control signal C2 and, conversely, will output the reference voltage (vref) as the select voltage (vsel) in response to a second logic state of the second control signal C2. The resistance of the first digitally controlled resistor Rd1 is selected in response to a first digital resistance control signal (Rd1ctrl).

A low pass filter (LPF) circuit 114 filters the bias voltage (vbias) to generate the first control voltage (Vflt). The LPF circuit 114 is enabled for operation in response to the second logic state of the first control signal C1 during the normal mode of the operation for the VCO circuit 18'. In response to the first logic state of the first control signal C1, which as previously noted causes the first switching circuit 100 to selectively connect the control voltage inputs of the first and second voltage-to-current (V2I) converter circuits 30' and 32, the LPF circuit 114 is by-passed so that the bias voltage (vbias), unfiltered, is applied as the first control voltage (Vflt) during the calibration mode of operation for the VCO circuit 18'.

A fourth voltage-to-current (V2I) converter circuit 118 also receives the bias voltage (vbias) and generates a fourth current (i4) proportional to that bias voltage. A second switching circuit 120 that is actuated to a closed position in response to a first logic state of a third control signal C3 selectively applies the fourth current (i4) across a second digitally controlled resistor Rd2 to generate a second feedback voltage (Vd2). In response to the application of the control current (icnt), the ring oscillator circuit 36 produces the output signal (out) and the amplitude voltage (vampl) corresponds to a maximum amplitude of that output signal (out). A differential amplifier circuit 122 acting as a voltage comparator generates a difference voltage (vdif) as the amplified difference between the second feedback voltage (Vd2) and the amplitude voltage (vampl). An analog-to-digital converter (ADC) circuit 126 converts the analog difference voltage (vdif) to a multibit second digital resistance control signal (Rd2ctrl). The differential amplifier circuit 122 and the ADC circuit 126 are enabled for operation in response to the first logic state of the third control signal C3 (and, conversely, disable in response to a second logic state of the third control signal C3). The resistance of the second digitally controlled resistor Rd2 is selected in response to the second digital resistance control signal (Rd2ctrl). A third switching circuit 130 that is actuated to a closed position in response to the second logic state of the third control signal C3 (i.e., the logic inversion C3b of signal C3) bypasses the second digitally controlled resistor Rd2 and connects the second feedback voltage (Vd2) to ground.

A multibit digital multiplexer circuit 140 has a first input configured to receive the second digital resistance control signal (Rd2ctrl) and a second input configured to receive a calibration digital resistance control signal (Calctrl). The multibit digital multiplexer circuit 140 selects between the second digital resistance control signal (Rd2ctrl) and the calibration digital resistance control signal (Calctrl) in response to the second control signal C2. The multibit digital multiplexer circuit 140 will output the second digital resistance control signal (Rd2ctrl) as the first digital resistance control signal (Rd1ctrl) in response to the first logic state of the second control signal C2 and, conversely, will output the calibration digital resistance control signal (Calctrl) as the first digital resistance control signal (Rd1ctrl) in response to the second logic state of the second control signal C2.

The calibration digital resistance control signal (Calctrl) is generated by a digital calibration logic circuit 144 in response to the output signal (out) from the ring oscillator circuit 36, the input signal (in) to the PLL circuit and the frequency divisor of D for the frequency divider circuit 20 of the PLL circuit. The digital calibration logic circuit 144 is enabled for operation in response to a fourth control signal C4.

A control circuit 148 generates the control signals C1, C2, C3 and C4 to control operation as follows:

To start the calibration process, the first control signal C1 is set in the first logic state to actuate switch 100 and selectively connect control voltage inputs of the first and second voltage-to-current (V2I) converter circuits 30' and 32 so that the first control voltage (Vflt) and the second control voltage (v) are equal. As noted above, this places the VCO circuit 18' in the calibration mode of operation where the LPF circuit 114 is bypassed, so that v=vflt=vbias and the VCO circuit 18' is effectively disconnected from (i.e., is not being controlled by) the PLL circuit loop, but it will be noted that the input signal (in) and loop divider value D for the PLL circuit loop are being received by the digital calibration logic 144. Additionally, the second control signal C2 is set in the second logic state so that the voltage multiplexing circuit 110 outputs the reference voltage (vref) as the select voltage (vsel) applied to one input of the differential amplifier circuit 106 and further so that the multibit digital multiplexer circuit 140 outputs the calibration digital resistance control signal (Calctrl), generated by the digital calibration logic 144, as the first digital resistance control signal (Rd1ctrl). Furthermore, the fourth control signal C4 is asserted to enable operation of the digital calibration logic circuit 144 to generate the calibration digital resistance control signal (Calctrl). Still further, the third control signal C3 is set in the second logic state so that the differential amplifier circuit 122 and the ADC circuit 126 are disabled, the switching circuit 120 is opened and the switching circuit 130 is closed.

With this configuration, a first (frequency) phase of the calibration mode of operation is then performed. The first current (i1) is generated in response to the voltage v=vflt and the second current (i2) is also generated in response to the voltage vflt. The ring oscillator circuit 36 thus generates the output signal (out) having a frequency that is controlled by the bias voltage vbias (since v=vflt=vbias). The third current (i3) is also generated by the third voltage to current generator 102 in response to the bias voltage vbias. Due to the relative sizes of the voltage to current converters 30', 32 and 102 operating in response to the applied bias voltage vbias, the following relative current condition is applicable: i3=icnt=i1+i2. The application of the third current (i3) across the first digitally controlled resistor Rd1 generates the first feedback voltage (Vd1) for application to the second input of the differential amplifier circuit 106. The bias voltage vbias is generated in response to the voltage difference between the first feedback voltage (Vd1) and the select voltage (vsel).

In response to the generated bias voltage (vbias), the control current (icnt) is output and the ring oscillator generates the output signal (out) having an oscillation frequency which is dependent on vbias. The digital calibration logic circuit 144 operates to determine the frequency difference between the output signal (out) divided by the divisor D and the input signal (in) (i.e., out/D− in), keeping in mind here that the PLL circuit loop is disconnected in this mode. Using negative feedback, the digital calibration logic circuit 144 controls the value of the calibration digital resistance control signal (Calctrl), and thus correspondingly the value of the first digital resistance control signal (Rd1ctrl), to vary the resistance of the first digitally controlled resistor Rd1 and correspondingly the magnitude of the current i3 (=Vd1/Rd1), as the first feedback Vd1 remains fixed at Vsel through the amplifier 106 feedback loop. The change causes a corresponding change in the bias voltage (vbias) so as to drive the frequency of the output signal (out) divided by D to substantially equal the frequency of the input signal (in) (for example, within a first threshold value in frequency). When this operating condition is achieved, the first phase of the calibration mode of operation ends. It will be noted that the resistance of the first digitally controlled resistor Rd1 as set by the value of the first digital resistance control signal (Rd1ctrl) at the end of the first (frequency) phase of the calibration mode of operation sets the value of the bias voltage (vbias) necessary to achieve the desired operating frequency of the ring oscillator 36.

At this point in time, the fourth control signal C4 is deasserted to disable operation of the digital calibration logic circuit 144. This is an effective means for saving power consumption during further calibration operations as well as during normal PLL mode following completion of the calibration process. The third control signal C3 is then set in the first logic state so that the differential amplifier circuit 122 and the ADC circuit 126 are enabled, the switching circuit 120 is closed and the switching circuit 130 is open.

With this configuration, a second (amplitude) phase of the calibration mode of operation is then performed. The bias voltage (vbias) continues to be generated with a magnitude set by the resistance of the first digitally controlled resistor Rd1, and the voltage to current converter 118 generates the fourth current (i4) in response to the bias voltage (vbias) such that the i4=i3=icnt. The application of the fourth current (i4) across the second digitally controlled resistor Rd2 generates the second feedback voltage (Vd2) for application to the second input of the differential amplifier circuit 122. The first input of the differential amplifier circuit 122 receives the amplitude voltage (vampl) for the output signal (out) being generated by the ring oscillator circuit 36. The difference voltage Vdif is generated as the voltage difference between the second feedback voltage (Vd2) and the amplitude voltage (vampl). This difference is converted by ADC circuit 126 to the second digital resistance control signal (Rd2ctrl) which controls the resistance of the second digitally controlled resistor Rd2.

Using negative feedback, the value of the second digital resistance control signal (Rd2ctrl) is modulated to vary the resistance of the second digitally controlled resistor Rd2 and drive the magnitude of the voltage (vd2) towards the amplitude voltage (vampl). When the voltage (vd2) is substantially equal to the amplitude voltage (vampl), for example, within a second threshold value in voltage, the second (amplitude) phase of the calibration mode of operation ends. It will be noted that the resistance of the second digitally controlled resistor Rd2 as set by the value of the second digital resistance control signal (Rd2ctrl) at the end of the second (amplitude) phase of the calibration mode of operation is substantially equal to the effective resistance of the ring oscillator circuit 36 due to the ratio of the amplitude voltage (vampl) to the current (i4). In this context, the substantially equal resistance values are considered to mean that the values are equal to within the resolution of capabilities of the second digitally controlled resistor Rd2 (e.g., equal to each other within the resistance step limitations for the programmability of the second digitally controlled resistor Rd2).

The third control signal C3 is then returned to the second logic state in order to save power consumption by disabling the differential amplifier circuit 122 and the ADC circuit 126, opening the switching circuit 120 and closing the switching circuit 130. The second control signal C2 is now changed to the first logic state so that the voltage multiplexing circuit 110 instead outputs the amplitude voltage (vampl) as the select voltage (vsel) applied to the first input of the differential amplifier circuit 106 and the multibit digital multiplexer circuit 140 instead outputs the second digital resistance control signal (Rd2ctrl) as the first digital resistance control signal (Rd1ctrl). This effectively causes the resistance of the first digitally controlled resistor Rd1 to change from the resistance as set by the value of the first digital resistance control signal (Rd1ctrl) at the end of the first (frequency) phase of the calibration mode of operation to the resistance of the second digitally controlled resistor Rd2 as set by the value of the second digital resistance control signal (Rd2ctrl) at the end of the second (amplitude) phase of the calibration mode of operation.

The calibration mode of operation for the VCO circuit 18' is then completed when the first control signal C1 is returned to the second logic state which deactuates switch 100 so as to disconnect the control voltage inputs of the first and second voltage-to-current (V2I) converter circuits 30' and 32 and remove the bypass of the LPF circuit 114. With the LPF circuit 114 now active (enabled), the cutoff frequency for the loop generating the voltage (Vflt) that controls the first voltage-to-current (V2I) converter circuit 30' is reduced. The disconnection of the control voltage inputs of the first and second voltage-to-current (V2I) converter circuits 30' and 32 enables the first voltage-to-current (V2I) converter circuit 30' to generate the first current (i1) as a function of a self-tracking loop dependent on the resistance of the first digitally controlled resistor Rd1 and the ring oscillator circuit amplitude (vampl) and further enables the second voltage-to-current (V2I) converter circuit 32 to generate the second current (i2) as a function of the control voltage (v) for the PLL circuit loop.

Because the first current (i1) is dependent on the amplitude of the output signal (out) generated by the ring oscillator circuit 36, the first current (i1) will track the frequency of oscillation and to some extent also track the temperature behavior of the oscillator circuit 36. The process spread of the path for the first current (i1) is reduced through use of the second phase of the calibration mode of operation to determine the effective resistance of the ring oscillator circuit 36 for replication using the controlled resistance of the second digitally controlled resistor Rd2 in the third current (i3) path. As a result, a much lower VCO gain can be achieved without having difficulties in covering oscillator temperature spread and the high frequency effects of the PLL clock frequency.

In the normal mode of operation, the self-tracking loop is part of the PLL path and adds an extra pole (at $w_p'$) and an extra zero (at $w_z'$). The resulting loop transfer function s given by:

$$\frac{K_{VCO} * I_{CP} * c * \left(1 + \frac{s}{w_z'}\right) * \left(1 + \frac{s}{w_z'}\right)}{2\pi * N * s^2 * C_L * \left(1 + \frac{s}{w_p'}\right)} \text{ with}$$

$$w_p' = 1/c * R_{LPF} * C_{LPF};$$

$$w_Z' = 1/R_{LPF} * C_{LPF}; \text{ and}$$

$$w_z = 1/R_{LF} * C_L;$$

where: $K_{VCO}$ is the VCO gain; $I_{CP}$ is the charge pump circuit 14 current; c is a constant greater than one; $R_{LPF}$ is the resistance of the resistor within the LPF circuit 114; $C_{LPF}$ is the capacitance of the capacitor within the LPF circuit 114; $C_L$ is the capacitance of the primary (i.e., large) integration capacitor of the PLL loop filter 16; $R_{LF}$ is the resistance of the PLL loop filter 16 and N is the division factor D of the loop divider 20.

Figure 4:
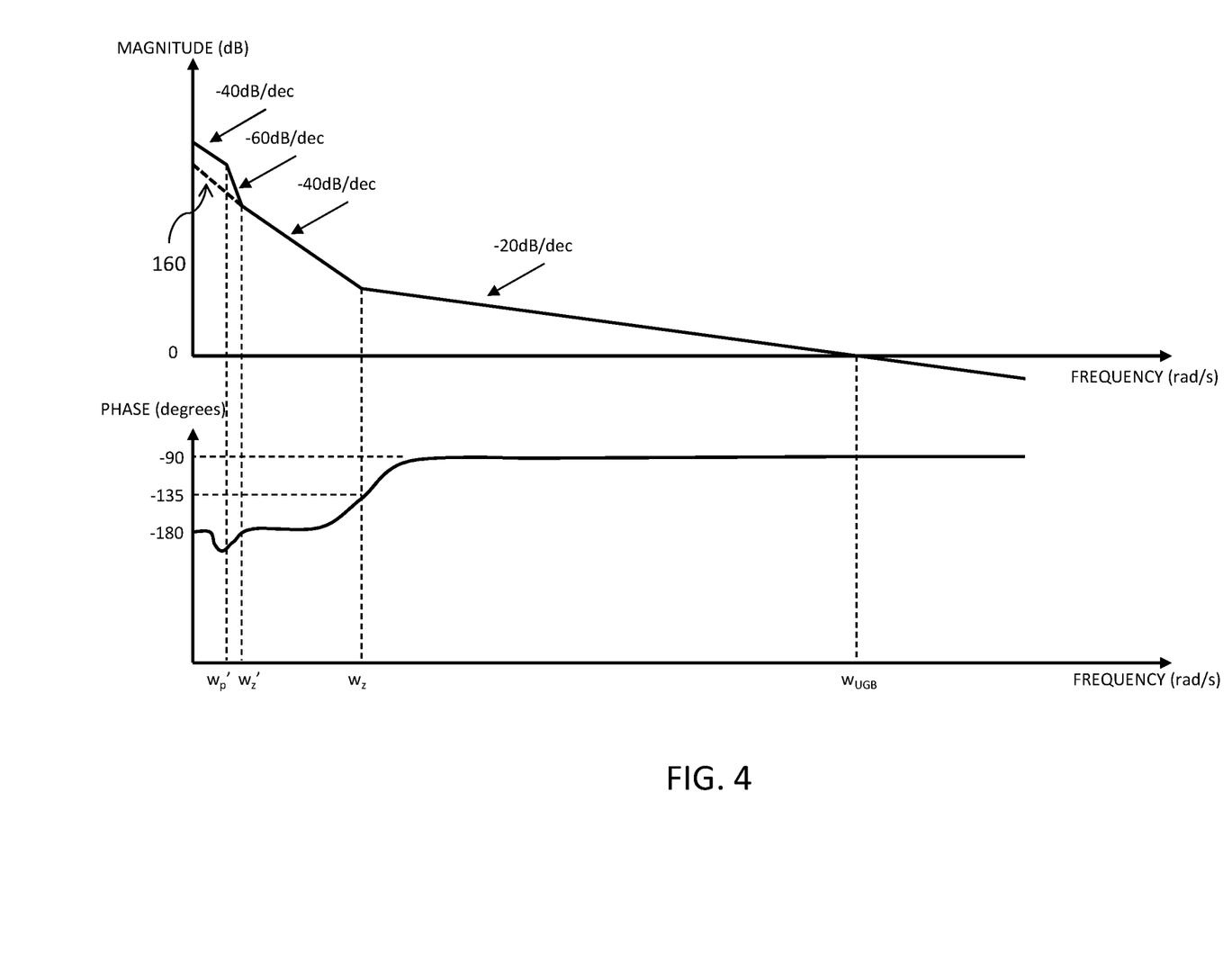
FIG. 4 shows Bode plots for magnitude and phase relating to operation of the PLL circuit with the VCO circuit of FIG. 3.

The Bode plots for magnitude and phase for the solution using the VCO circuit 18' after calibration is completed are shown in FIG. 4. FIG. 4 further shows, at reference 160, how the Bode plot would be different if the self-tracking loop were not operational.

With respect to PLL stability, the unity gain bandwidth (UGB) of the PLL using the VCO circuit 18' is given by:

$$\frac{K_{VCO} * I_{CP} * R_{LF}}{2\pi * N}$$

It will accordingly be noted that the system has the same UGB as a PLL which does not include the self-tracking loop. The extra pole and extra zero introduced by the self-tracking loop, when placed substantially before the UGB frequency, has no impact on PLL stability.

The PLL with the VCO circuit 18' accordingly possesses a number of advantages over known solutions including: a) VCO gain can be reduced further by 4 times with this technique, compared to the traditional hybrid PLLs (⅛ times vs ½ times), where the ratio of sizes of voltage to current converters 32 and 30' is 1:7, and b) there is no need for the use of a digital-to-analog converter in the voltage to current converter circuits (as a result, there is a savings in occupied circuit area and an improvement in VCO performance parameters like power supply rejection ratio (PSRR)). With respect to the advantage a), this ensures: i) that Loop Filter Resistance is increased by 4 times, and the Loop Filter Capacitances are reduced by 4 times without affecting the loop dynamics (as a result, there is a reduction in occupied circuit area along with a reduction in Loop Filter Resistor noise with power spectral density (PSD) becoming ¼ times in comparison), and ii) the Charge Pump Current is increased by 4 times, without affecting other parameters (as a result, there is a reduction in Charge Pump noise with PSD becoming ¼ times in comparison, a reduction in Loop Filter Resistor noise with PSD becoming ¹⁄₁₆ times in comparison, and an improvement in Charge Pump Linearity which can be important in connection with the operation of a Fractional-N PLL).

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An oscillator circuit, comprising:
   a first voltage to current converter circuit configured to convert a first voltage to a first current;
   a second voltage to current converter circuit configured to convert a second voltage to a second current;
   a third voltage to current converter circuit configured to convert a third voltage to a third current;
   a ring oscillator circuit configured to generate an output signal having a voltage amplitude and having a frequency which is controlled by a sum of the first and second currents;
   a first amplifier circuit configured to generate a voltage applied as both the first and third voltages in response to a difference between a first feedback voltage and the voltage amplitude;
   wherein variation in the second voltage causes a corresponding variation in the frequency of the output signal when said voltage applied as both the first and third voltages is fixed by the first amplifier circuit; and
   a first resistor across which the third current is applied to generate the first feedback voltage, wherein the first resistor has a resistance that is substantially equal to an effective resistance of the ring oscillator circuit.

2. The circuit of claim 1, further comprising a low pass filter configured to filter the first voltage.

3. An oscillator circuit, comprising:
   a first voltage to current converter circuit configured to convert a first voltage to a first current;
   a second voltage to current converter circuit configured to convert a second voltage to a second current;
   a third voltage to current converter circuit configured to convert a third voltage to a third current;
   a ring oscillator circuit configured to generate an output signal having a voltage amplitude and having a frequency which is controlled by a sum of the first and second currents;
   a first amplifier circuit configured to generate a voltage applied as both the first and third voltages in response to a difference between a first feedback voltage and the voltage amplitude;
   a first resistor across which the third current is applied to generate the first feedback voltage, wherein the first resistor has a resistance that is substantially equal to an effective resistance of the ring oscillator circuit; and
   a calibration circuit configured to determine the effective resistance of the ring oscillator circuit; and wherein the first resistor is a variable resistor and wherein the resistance of the first resistor is set by the calibration circuit in response to the determined effective resistance of the ring oscillator circuit.

4. The circuit of claim 3, wherein the calibration circuit comprises:
   a fourth voltage to current converter circuit configured to convert a fourth voltage to a fourth current, wherein the fourth voltage is a voltage applied as both the first and second voltages to cause the ring oscillator circuit to generate the output signal with a desired frequency;
   a second amplifier circuit configured to generate a difference voltage in response to a difference between a second feedback voltage and the voltage amplitude; and
   a second resistor across which the fourth current is applied to generate the second feedback voltage, wherein the second resistor has a variable resistance that is modulated by an output of the second amplifier circuit to drive the difference voltage towards zero.

5. The circuit of claim 4, wherein the modulated variable resistance is substantially equal to the effective resistance of the ring oscillator circuit.

6. The circuit of claim 5, wherein the calibration circuit further comprises a circuit configured to set the resistance of the first resistor to equal the modulated variable resistance of the second resistor.

7. The circuit of claim 4, wherein the calibration circuit further comprises a circuit configured to determine said voltage applied as both the first and second voltages which causes the ring oscillator circuit to generate the output signal with the desired frequency.

8. The circuit of claim 4, wherein said desired frequency is a phase lock loop (PLL) frequency.

9. An oscillator circuit, comprising:
   a first voltage to current converter circuit having a first input configured to receive a first voltage and a first output configured to generate a first current;
   a second voltage to current converter circuit having a second input configured to receive a second voltage and a second output configured to generate a second current;
   a ring oscillator circuit configured to generate an output signal having a voltage amplitude and having a frequency which is controlled by a sum of the first and second currents;
   a switch configured to selectively connect the first input to the second input; and
   a calibration circuit configured to actuate said switch connecting the first and second inputs and determine a voltage applied as both the first and second voltages to the first and second inputs which causes the frequency of the output signal from the ring oscillator circuit to have a desired frequency.

10. The circuit of claim 9, wherein the calibration circuit comprises:
    a third voltage to current converter circuit having a third input configured to receive a third voltage and a third output configured to generate a third current;
    a first amplifier circuit configured to generate the voltage in response to a difference between a first feedback voltage and a reference voltage; and
    a first resistor across which the third current is applied to generate the first feedback voltage, wherein the first resistor has a variable resistance that is modulated in response to a difference in frequency between the frequency of the output signal and the desired frequency to drive the difference in frequency towards zero.

11. The circuit of claim 10, wherein the calibration circuit further comprises a circuit configured to compare the frequency of the output signal to the desired frequency and generate a resistance control signal in response to the comparison which controls setting of the variable resistance of the first resistor.

12. The circuit of claim 10, wherein the calibration circuit further comprises:
a fourth voltage to current converter circuit configured to convert a fourth voltage to a fourth current, wherein the fourth voltage is said voltage applied as both the first and second voltages to cause the ring oscillator circuit to generate the output signal with the desired frequency;
a second amplifier circuit configured to generate a difference voltage in response to a difference between a second feedback voltage and the voltage amplitude; and
a second resistor across which the fourth current is applied to generate the second feedback voltage, wherein the second resistor has a variable resistance that is modulated by an output of the second amplifier circuit to drive the difference voltage towards zero.

13. The circuit of claim 12, wherein the modulated variable resistance is substantially equal to an effective resistance of the ring oscillator circuit.

14. The circuit of claim 13, wherein the calibration circuit further comprises a circuit configured to set the resistance of the first resistor to equal the modulated variable resistance of the second resistor.

15. A phase lock loop circuit, comprising:
a controlled oscillator having an input configured to receive an oscillation control voltage and an output configured to generate an oscillating signal at a frequency set by the oscillation control voltage; and
a loop circuit having a first input receiving the oscillating signal, a second input receiving a reference signal and an output generating the oscillation control voltage as a function of a difference between the oscillating signal and the reference signal;
wherein the controlled oscillator comprises:
a first voltage to current converter circuit configured to convert a current control voltage to a first current;
a second voltage to current converter circuit configured to convert the oscillation control voltage to a second current;
a third voltage to current converter circuit configured to convert the current control voltage to a third current;
a ring oscillator circuit configured to generate the oscillating signal having a voltage amplitude and having a frequency which is controlled by a sum of the first and second currents;
a first amplifier circuit configured to generate the current control voltage in response to a difference between a first feedback voltage and the voltage amplitude; and
a first resistor across which the third current is applied to generate the first feedback voltage, wherein the first resistor has a resistance that is substantially equal to an effective resistance of the ring oscillator circuit;
wherein variation in the oscillation control voltage causes a corresponding variation in the frequency of the oscillating signal when said current control voltage is fixed by the first amplifier circuit.

16. A phase lock loop circuit, comprising:
a controlled oscillator having an input configured to receive an oscillation control voltage and an output configured to generate an oscillating signal at a frequency set by the oscillation control voltage; and
a loop circuit having a first input receiving the oscillating signal, a second input receiving a reference signal and an output generating the oscillation control voltage as a function of a difference between the oscillating signal and the reference signal;
wherein the controlled oscillator comprises:
a first voltage to current converter circuit configured to convert a current control voltage to a first current;
a second voltage to current converter circuit configured to convert the oscillation control voltage to a second current;
a third voltage to current converter circuit configured to convert the current control voltage to a third current;
a ring oscillator circuit configured to generate the oscillating signal having a voltage amplitude and having a frequency which is controlled by a sum of the first and second currents;
a first amplifier circuit configured to generate the current control voltage in response to a difference between a first feedback voltage and the voltage amplitude;
a first resistor across which the third current is applied to generate the first feedback voltage, wherein the first resistor has a resistance that is substantially equal to an effective resistance of the ring oscillator circuit; and
a calibration circuit configured to determine the effective resistance of the ring oscillator circuit; and
wherein the first resistor is a variable resistor and wherein the resistance of the first resistor is set by the calibration circuit in response to the determined effective resistance of the ring oscillator circuit.

17. The circuit of claim 16, wherein the calibration circuit comprises:
a switching circuit configured to apply the current control voltage also as the oscillation control voltage, with the current control voltage at a level which causes the frequency of the oscillating signal output by the ring oscillator circuit to substantially equal a desired frequency of the phase lock loop circuit;
a fourth voltage to current converter circuit configured to convert the current control voltage to a fourth current;
a second amplifier circuit configured to generate a difference voltage in response to a difference between a second feedback voltage and the voltage amplitude; and
a second resistor across which the fourth current is applied to generate the second feedback voltage, wherein the second resistor has a variable resistance that is modulated by an output of the second amplifier circuit to drive the difference voltage towards zero.

18. The circuit of claim 17, wherein the modulated variable resistance is substantially equal to the effective resistance of the ring oscillator circuit.

19. The circuit of claim 18, wherein the calibration circuit further comprises a circuit configured to set the resistance of the first resistor to equal the modulated variable resistance of the second resistor.

* * * * *